(12) United States Patent
Chen et al.

(10) Patent No.: US 12,183,249 B2
(45) Date of Patent: Dec. 31, 2024

(54) DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventors: Yong Chen, Wuhan (CN); Kai Lu, Wuhan (CN); Zuomin Liao, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/263,422

(22) PCT Filed: Oct. 30, 2020

(86) PCT No.: PCT/CN2020/125395
§ 371 (c)(1),
(2) Date: Apr. 22, 2023

(87) PCT Pub. No.: WO2022/036864
PCT Pub. Date: Feb. 24, 2022

(65) Prior Publication Data
US 2023/0252930 A1    Aug. 10, 2023

(30) Foreign Application Priority Data
Aug. 20, 2020 (CN) .......................... 202010843244.1

(51) Int. Cl.
*G09G 3/20* (2006.01)

(52) U.S. Cl.
CPC ... *G09G 3/2092* (2013.01); *G09G 2300/0426* (2013.01)

(58) Field of Classification Search
CPC .......... G09G 3/2092; G09G 2300/0426; H01L 29/78633; H01L 29/78645
See application file for complete search history.

(56) References Cited

U.S. PATENT DOCUMENTS

2004/0257489 A1\* 12/2004 Gotoh ............... G02F 1/136209
257/E27.113
2016/0322351 A1\* 11/2016 Moens .................. H01L 29/205
(Continued)

FOREIGN PATENT DOCUMENTS

| CN | 1652339 A | 8/2005 |
|----|-----------|--------|
| CN | 105470262 A | 4/2016 |

(Continued)

OTHER PUBLICATIONS

International Search Report in International application No. PCT/CN2020/125395, mailed on Feb. 25, 2021.
(Continued)

*Primary Examiner* — Kevin M Nguyen
(74) *Attorney, Agent, or Firm* — PV IP PC; Wei Te Chung

(57) ABSTRACT

A display panel and a manufacturing method thereof are provided. The display panel includes a substrate, a gate layer including a plurality of gate units disposed over the substrate, a first insulating layer disposed on the gate layer, and a metal shielding layer disposed on the first insulating layer. The metal shielding layer includes metal shielding units corresponding to the gate units. By setting the metal shielding layer, an electric shielding principle is used to reduce an influence of an alternating current signal between the gate units and improve display performance.

17 Claims, 6 Drawing Sheets

(56) References Cited

U.S. PATENT DOCUMENTS

| | | | |
|---|---|---|---|
| 2017/0338252 A1* | 11/2017 | Lee .................. | H01L 29/78633 |
| 2018/0033979 A1* | 2/2018 | Jang ..................... | B32B 27/322 |
| 2019/0206979 A1* | 7/2019 | Han ....................... | H01L 27/12 |
| 2020/0083309 A1* | 3/2020 | Wang .................. | H10K 59/126 |

FOREIGN PATENT DOCUMENTS

| | | | |
|---|---|---|---|
| CN | 105867692 A | | 8/2016 |
| CN | 106952940 A | | 7/2017 |
| CN | 107256872 A | | 10/2017 |
| CN | 107799532 A | | 3/2018 |
| CN | 110085628 A | | 8/2019 |
| CN | 110299384 A | | 10/2019 |
| CN | 110797356 A | | 2/2020 |
| JP | 2002149087 A | | 5/2002 |
| KR | 20160071528 A | | 6/2016 |
| WO | 2019138734 A1 | | 7/2019 |

OTHER PUBLICATIONS

Written Opinion of the International Search Authority in International application No. PCT/CN2020/125395,mailed on Feb. 25, 2021.

Chinese Office Action issued in corresponding Chinese Patent Application No. 202010843244.1 dated Mar. 23, 2022, pp. 1-6.

* cited by examiner

DISPLAY PANEL AND MANUFACTURING METHOD THEREOF

RELATED APPLICATIONS

This application is a Notional Phase of PCT Patent Application No. PCT/CN2020/125395 having international filing date of Oct. 30, 2020, which claims the benefit of priority of Chinese Patent Application No. 202010843244.1 filed on Aug. 20, 2020. The contents of the above applications are all incorporated by reference as if fully set forth herein in their entirety.

FIELD OF DISCLOSURE

The present disclosure relates to the field of displays, in particular to a display panel and a manufacturing method thereof.

BACKGROUND

With an improvement of living standards, display screens with extremely narrow bezels are becoming more and more popular among major manufacturers and people.

In the prior art, in a display screen with an extremely narrow bezel or a high-resolution screen, a wiring of array units is very dense and complicated. The array units are easily affected by a coupling effect of an alternating current (AC) signal in adjacent components, resulting in uneven display and abnormal display.

Therefore, there is an urgent need for a display panel and a manufacturing method thereof to solve the above technical problems.

SUMMARY OF DISCLOSURE

The present disclosure provides a display panel and a manufacturing method thereof to solve the technical problems that in the prior art, array units are easily affected by a coupling effect of alternating current signals in adjacent components, which causes uneven display.

To solve the above problems, technical solutions provided by the present disclosure are as follows:

A display panel includes a substrate, a gate layer disposed over the substrate, a first insulating layer disposed on the gate layer, and a metal shielding layer disposed on the first insulating layer.

The gate layer includes a plurality of gate units, the metal shielding layer includes a plurality of metal shielding units, and one of the metal shielding units corresponds to one of the gate units.

The metal shielding layer is configured to shield an alternating current signal between two adjacent gate units.

In the display panel of the present disclosure, the gate units include a first gate and at least one second gate opposite to the first gate, and the first gate is insulated from the second gate.

In one sub-pixel, an orthographic projection of the first gate or/and an orthographic projection of the second gate on the substrate is within an orthographic projection of the metal shielding units on the substrate.

In the display panel of the present disclosure, any one of the metal shielding units is electrically connected to a constant voltage signal terminal of the display panel.

In the display panel of the present disclosure, the display panel further includes a source/drain layer disposed over the first insulating layer. The metal shielding layer is electrically connected to the source/drain layer.

In the display panel of the present disclosure, the source/drain layer includes a plurality of first source/drain units and a second source/drain unit corresponding to the first source/drain units, and the first source/drain units and the second source/drain unit are arranged in different layers.

The first source/drain units include a first sub-source unit and a first sub-drain unit, the second source/drain unit includes a second sub-source unit, the second sub-source unit is electrically connected to the first sub-source unit, and the metal shielding layer is disposed between the first source/drain units and the second source/drain unit.

In the display panel of the present disclosure, the display panel further includes a second insulating layer disposed over a source/drain layer and an anode layer disposed on the second insulating layer.

The anode layer includes a plurality of anode units, and one of the metal shielding units is electrically connected to one of the anode units.

In the display panel of the present disclosure, the display panel further includes a metal light-shielding layer disposed on the substrate. A plurality of source units of a source/drain layer are electrically connected to the metal light-shielding layer through a plurality of first via holes, and the metal shielding layer is electrically connected to the metal light-shielding layer through a plurality of second via holes.

In the display panel of the present disclosure, the metal shielding units at least include a first shielding part and a second shielding part, and the first shielding part and the second shielding part are arranged in different layers.

The first shielding part is electrically connected to source units of a source/drain layer, the second shielding part is electrically connected to a drain unit of the source/drain layer, or the second shielding part is electrically connected to an anode layer.

In the display panel of the present disclosure, the display panel includes a first region close to a bending area, and in a direction of a data line, a distance between two adjacent array units in the first region is less than a distance between two adjacent array units on a periphery of the first region.

The metal shielding layer is disposed in the first region.

In the display panel of the present disclosure, in the first region, there is no array unit in an orthographic projection of a portion of a light-emitting unit of the display panel on the display panel, and the light-emitting unit is electrically connected to a corresponding array unit through a lead.

The present disclosure also provides a manufacturing method of a display panel, including:

forming a gate layer including a plurality of gate units over a substrate;

forming a first insulating layer on the gate layer; and forming a metal shielding layer including a plurality of metal shielding units on the first insulating layer.

One of the metal shielding units corresponds to one of the gate units, and the metal shielding layer is configured to shield an alternating current signal between two adjacent gate units.

In the manufacturing method of the display panel of the present disclosure, the steps of forming the gate layer and the first insulating layer include:

forming a plurality of first gates on the substrate;

forming a first sub insulating layer on the first gates;

forming a plurality of second gates on the first sub insulating layer; and forming a second sub insulating layer on the second gate.

The first sub insulating layer and the second sub insulating layer together form the first insulating layer, the first gates and the second gates are disposed oppositely, and an orthographic projection of the first gates or/and the second gates on the substrate is within an orthographic projection of corresponding metal shielding units on the substrate.

In the manufacturing method of the display panel of the present disclosure, any one of the metal shielding units is electrically connected to a constant voltage signal terminal of the display panel.

In the manufacturing method of the display panel of the present disclosure, before forming the first insulating layer on the gate layer, the method further includes:

forming a source/drain layer on the first insulating layer.

The metal shielding layer is electrically connected to the source/drain layer.

In the manufacturing method of the display panel of the present disclosure, the step of forming the source/drain layer on the first insulating layer includes:

forming a plurality of first source/drain units including a first sub-source unit and a first sub-drain unit over the first insulating layer;

forming a fifth insulating layer over the first source/drain units;

forming a plurality of third via holes on the fifth insulating layer, where the third via holes expose the first sub-source unit; and forming a second drain unit corresponding to the first drain unit on the fifth insulating layer.

The second source/drain unit includes a second sub-source unit, the second sub-source unit is electrically connected to the first sub-source unit, and the metal shielding layer is disposed between the first source/drain units and the second source/drain unit.

In the manufacturing method of the display panel of the present disclosure, before forming the gate layer, the method further includes forming a metal light-shielding layer on the substrate.

In the step of forming the first insulating layer, the method further includes forming a plurality of first via holes on the first insulating layer, and the first via holes expose the metal light-shielding layer.

In the step of forming the fifth insulating layer, the method further includes forming a plurality of second via holes on the fifth insulating layer, and the second via holes expose the metal light-shielding layer.

The source/drain layer is electrically connected to the metal light-shielding layer through the first via holes, and the metal shielding layer is electrically connected to the metal light-shielding layer through the second via holes.

In the manufacturing method of the display panel of the present disclosure, after forming the metal shielding layer including the plurality of metal shielding units on the first insulating layer, the method further includes:

forming a second insulating layer on a source/drain layer of the display panel;

forming a plurality of fourth via holes on the second insulating layer; and forming an anode layer including a plurality of anode units on the second insulating layer.

The metal shielding units are electrically connected to the anode units through the fourth via holes.

In the manufacturing method of the display panel of the present disclosure, the metal shielding units at least include a first shielding part and a second shielding part, and the first shielding part and the second shielding part are arranged in different layers.

The first shielding part is electrically connected to a source unit of a source/drain layer, the second shielding part is electrically connected to a drain unit of the source/drain layer, or the second shielding part is electrically connected to an anode layer.

In the manufacturing method of the display panel of the present disclosure, the display panel includes a first region close to a bending area, and in a direction of a data line, a distance between two adjacent array units in the first region is less than a distance between two adjacent array units on a periphery of the first region.

The metal shielding layer is disposed in the first region.

In the manufacturing method of the display panel of the present disclosure, in the first region, there is no array unit in an orthographic projection of a portion of a light-emitting unit of the display panel on the display panel, and the light-emitting unit is electrically connected to a corresponding array unit through a lead.

In the present disclosure, by disposing the metal shielding layer on the gate layer and using a principle of electrical shielding, an influence of an alternating current signal between two adjacent gate units is reduced, thereby avoiding uneven display and improving display performance.

DETAILED DESCRIPTION

Figure 1:
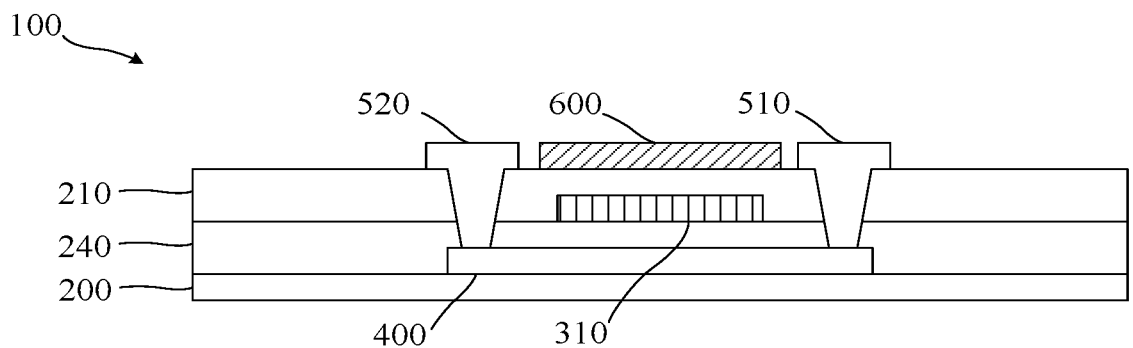
FIG. 1 is a schematic diagram of a first structure of a display panel of the present disclosure.
Figure 2:
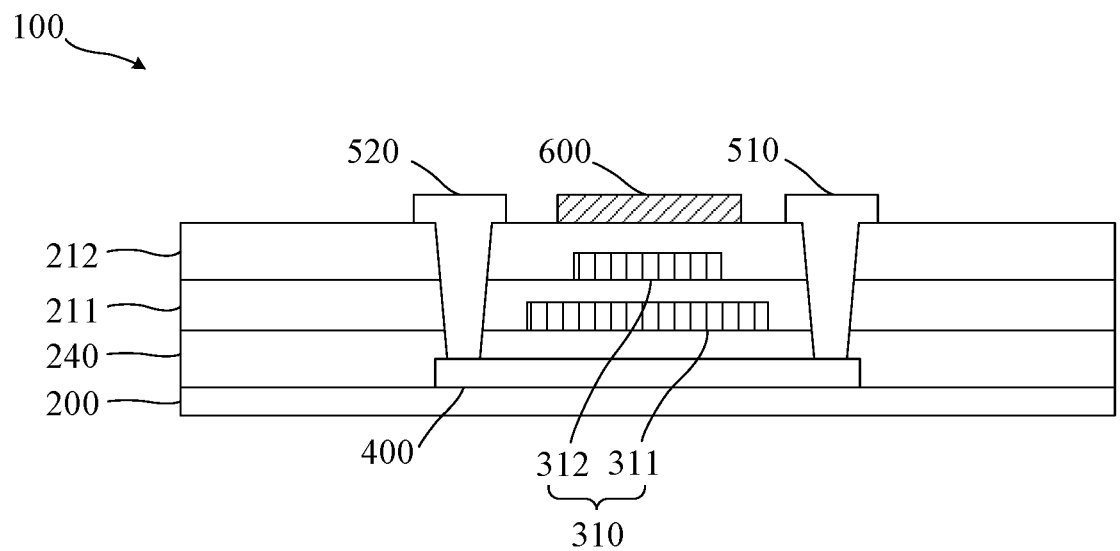
FIG. 2 is a schematic diagram of a second structure of a display panel of the present disclosure.

The present disclosure provides a display panel and a manufacturing method thereof. In order to make the purpose, technical solutions, and effects of the present disclosure clearer and specific, the present disclosure will be further described in detail with reference to the accompanying drawings and embodiments. It should be understood that the specific embodiments described herein are only used to explain the present disclosure, and are not used to limit the present disclosure.

Please refer to FIG. 1 to FIG. 9, the present disclosure provides a display panel 100, including a substrate 200, a gate layer disposed over the substrate 200, a first insulating layer 210 disposed on the gate layer, and a metal shielding layer disposed on the first insulating layer 210.

The gate layer includes a plurality of gate units 310. The metal shielding layer includes a plurality of metal shielding units 600. One of the metal shielding units 600 corresponds to one of the gate units 310.

The metal shielding layer is configured to shield an alternating current (AC) signal between two adjacent gate units 310.

The present disclosure uses a principle of electrical shielding by disposing the metal shielding layer on the gate layer to reduce an influence of the AC signal between two adjacent gate units, thereby avoiding uneven display and improving display performance.

The technical solutions of the present disclosure are described in conjunction with specific embodiments.

Please refer to FIG. 1 to FIG. 9, the display panel 100 includes the substrate 200, the gate layer disposed over the substrate 200, the first insulating layer 210 disposed on the gate layer, and the metal shielding layer disposed on the first insulating layer 210. The gate layer includes the plurality of gate units 310. The metal shielding layer includes the plurality of metal shielding units 600. One of the metal shielding units 600 corresponds to one of the gate units 310. The metal shielding layer is configured to shield the AC signal between two adjacent gate units 310.

In this embodiment, a shielding principle of the metal shielding layer is similar to an electromagnetic shielding principle of Faraday electromagnetic cage. By disposing the metal shielding units 600 near the gate units 310 to reflect surrounding AC signals, the influence of the AC signal between the gate units 310 is avoided, thereby avoiding uneven display and improving the display performance.

In this embodiment, the display panel 100 further includes an active layer 400 disposed on the third insulating layer 230 and a fourth insulating layer 240 disposed on the active layer 400. The gate layer is disposed on the fourth insulating layer 240 and away from the substrate 200. The active layer 400 includes a plurality of silicon islands, and a source/drain layer is electrically connected to the active layer 400 through via holes. That is, a source unit and a drain unit are electrically connected to the silicon islands through the via holes. In the drawings, a reference numeral "400" is used to represent the silicon island, and the number will not be repeated, please refer to FIG. 1 to FIG. 9 for details.

Figure 3:
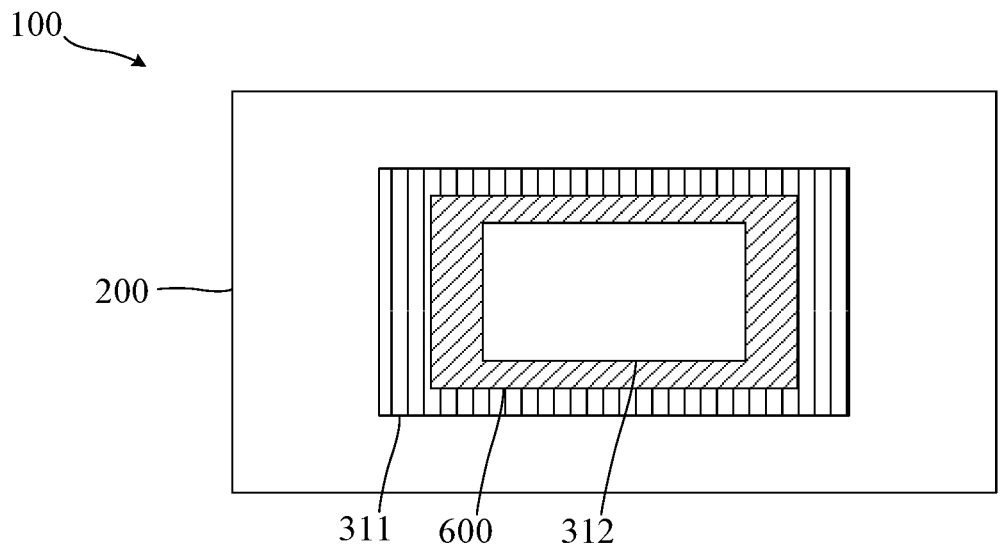
FIG. 3 is a partial top view of the display panel of the present disclosure.
Figure 4:
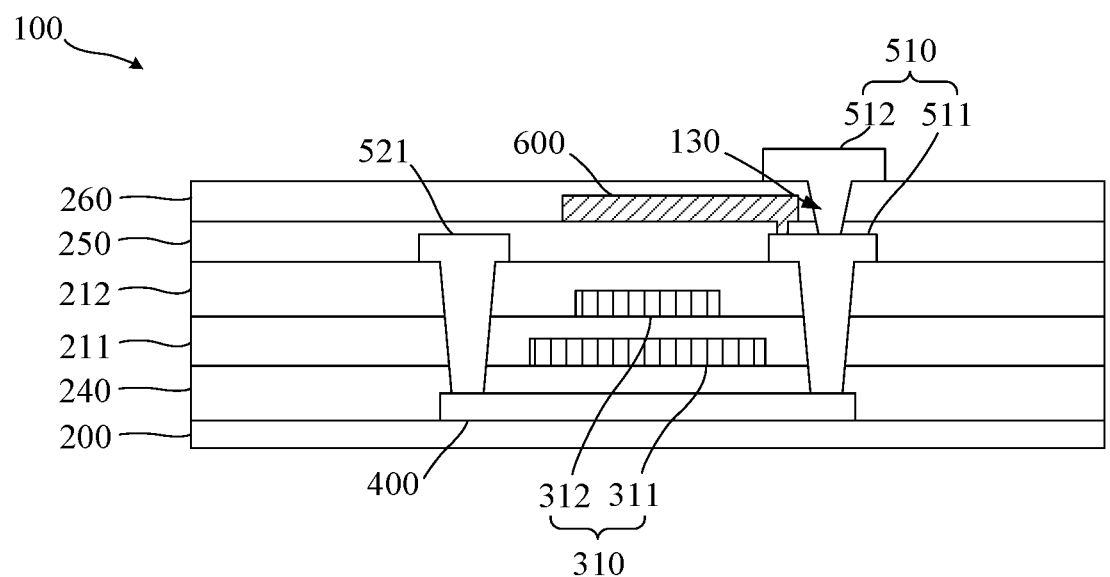
FIG. 4 is a schematic diagram of a third structure of a display panel of the present disclosure.
Figure 5:
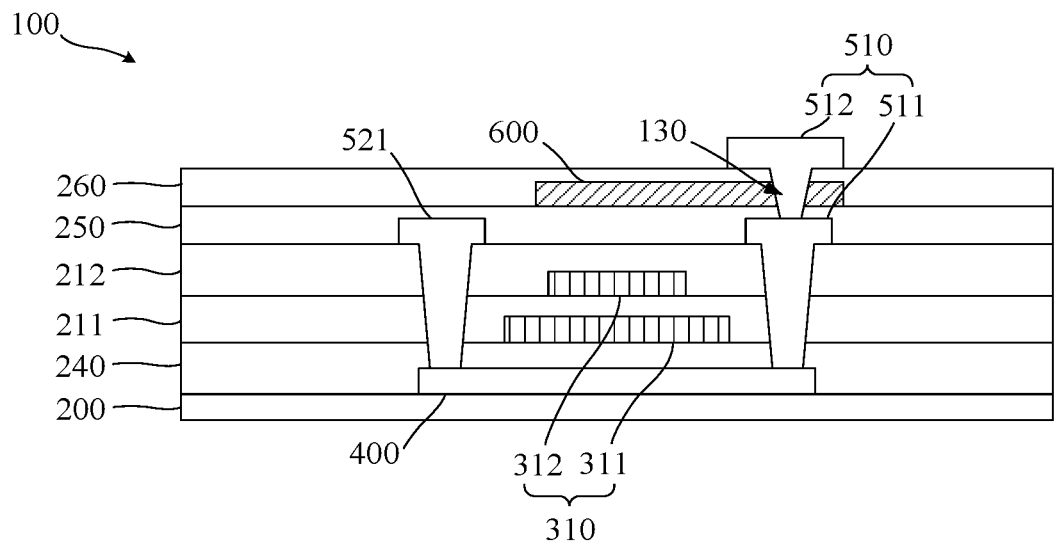
FIG. 5 is a schematic diagram of a fourth structure of a display panel of the present disclosure.
Figure 6:
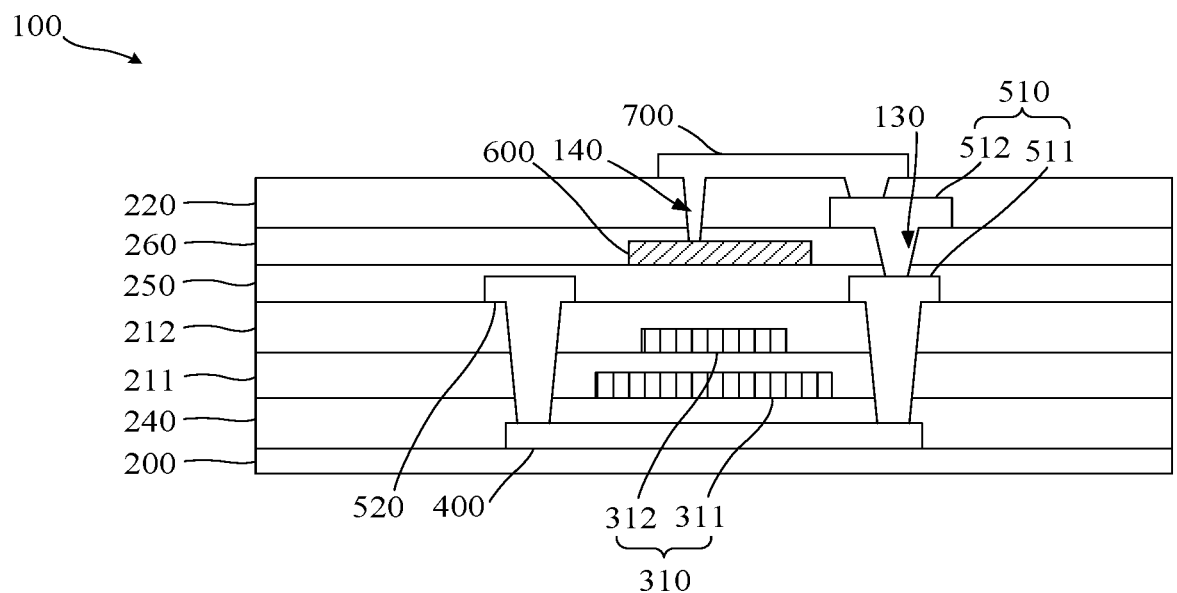
FIG. 6 is a schematic diagram of a fifth structure of a display panel of the present disclosure.
Figure 7:
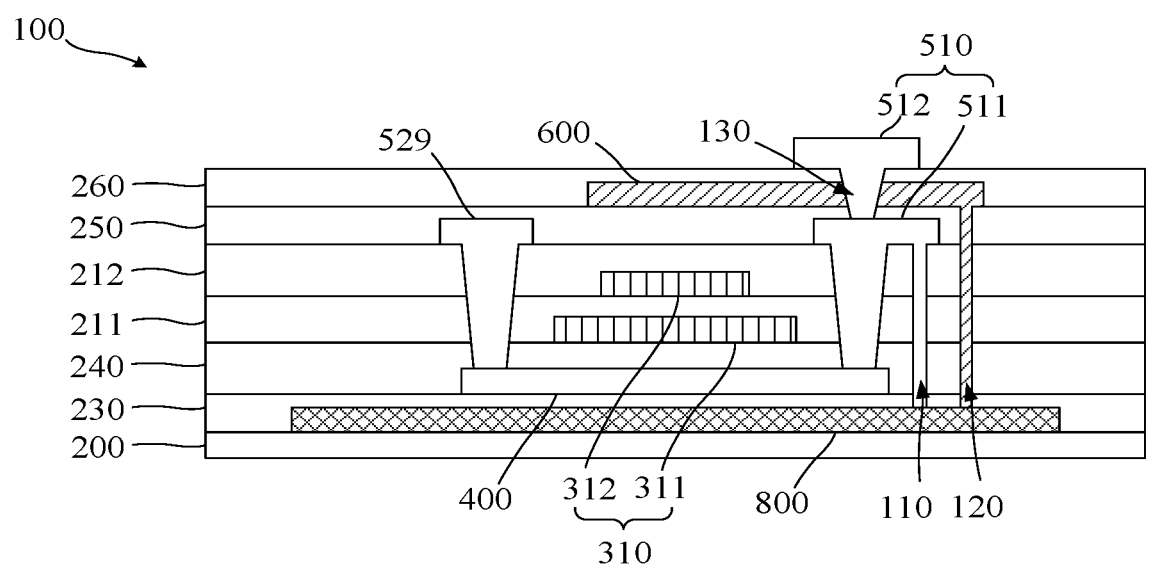
FIG. 7 is a schematic diagram of a sixth structure of a display panel of the present disclosure.
Figure 8:
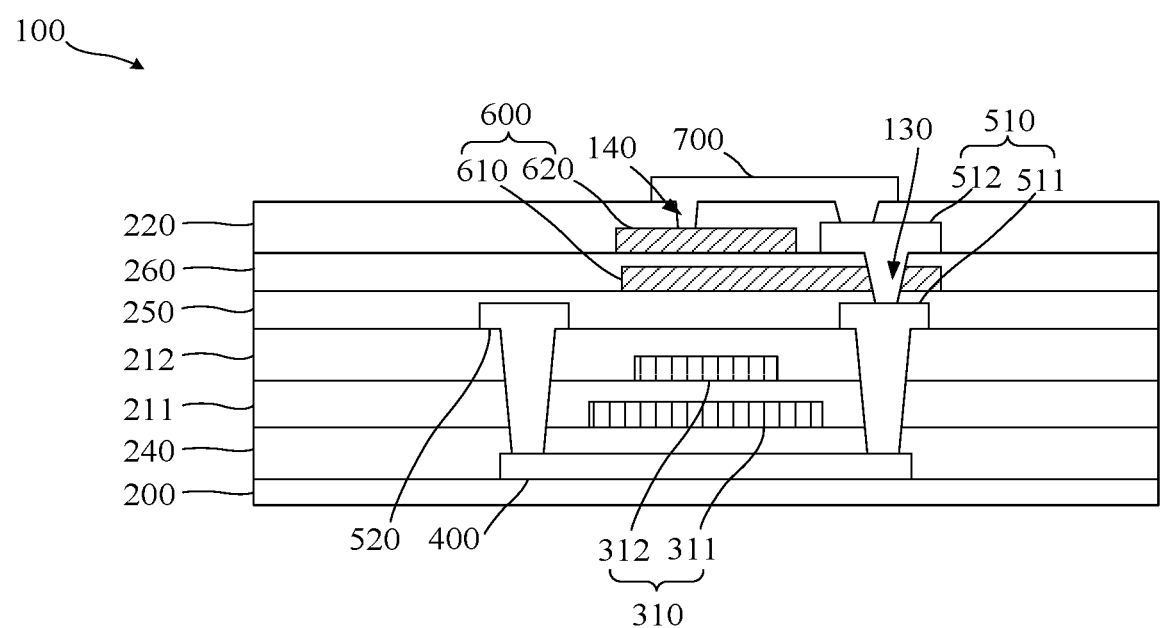
FIG. 8 is a schematic diagram of a seventh structure of a display panel of the present disclosure.
Figure 9:
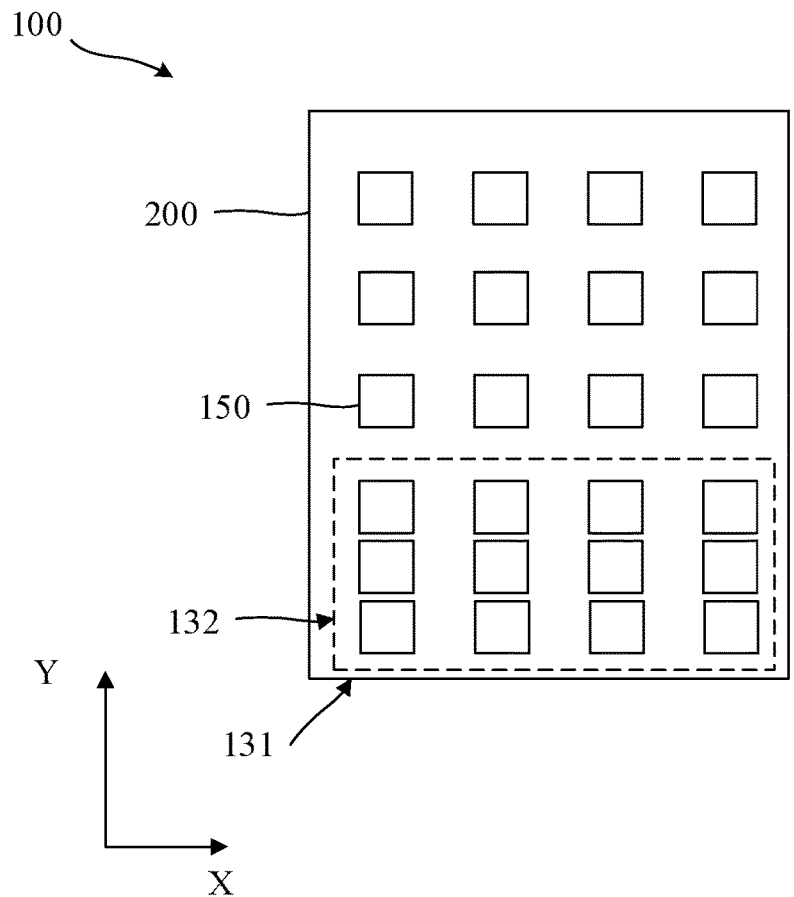
FIG. 9 is a top view of the display panel of the present disclosure.
Figure 10:
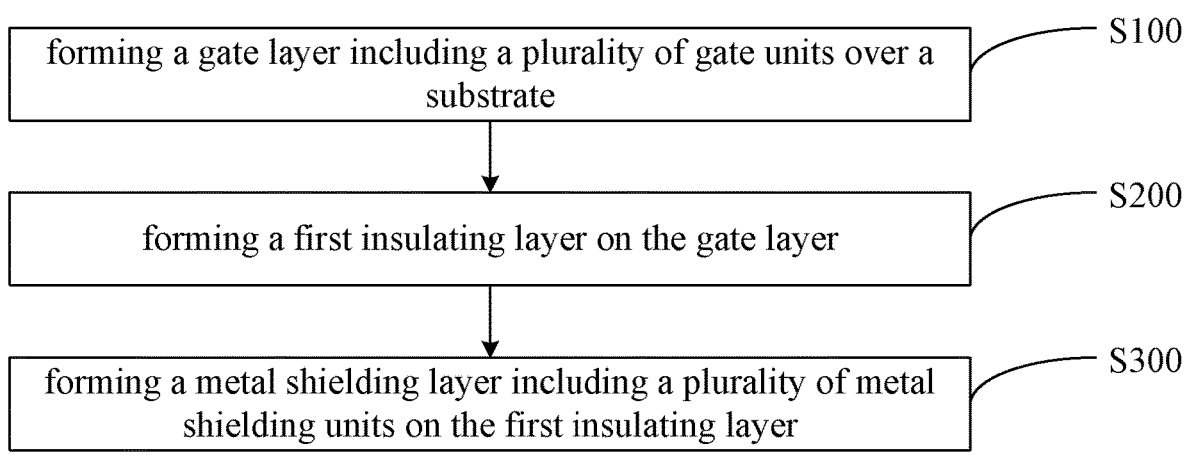
FIG. 10 is a flow chart of a manufacturing method of a display panel of the present disclosure.

In this embodiment, the gate units 310 include a first gate 311 and at least one second gate 312 disposed opposite to the first gate 311. The first gate 311 and the second gate 312 are insulated from each other. In a sub-pixel, an orthographic projection of the first gate 311 on the substrate 200 is within an orthographic projection of the corresponding metal shielding units 600 on the substrate 200, and/or an orthographic projection of the second gate 312 on the substrate 200 is within the orthographic projection of the corresponding metal shielding units 600 on the substrate 200. The display panel 100 includes a first sub insulating layer 211 disposed between the first gate 311 and the second gate 312 and a second sub insulating layer 212 disposed on the second gate. The first sub insulating layer 211 and the second sub insulating layer 212 together form the first insulating layer 210. Please refer to FIG. 2 and FIG. 3 for details. In FIG. 3, a perspective relationship of the second gate 312 is moved to a top for convenience of display. In fact, the second gate 312 is disposed between a first gate 311 and the metal shielding units 600. The shielding principle of the metal shielding layer is similar to the electromagnetic shielding principle of the Faraday electromagnetic cage. By setting the metal shielding units 600 near the gate units 310 to reflect the surrounding AC signals, the influence of the AC signal between the gate units 310 is avoided, thereby avoiding uneven display and improving the display performance.

In this embodiment, in comparison to the second gate 312 of the unit 310, the first gate 311 of the unit 310 is disposed on a side close to the substrate 200. The orthographic projection of the second gate 312 of the unit 310 on the substrate 200 is within the orthographic projection of the first gate 311 of the unit 310 on the substrate 200. The orthographic projection of the second gate 312 on the substrate 200 is within the orthographic projection of the metal shielding units 600 on the substrate 200. Please refer to FIG. 2 and FIG. 3 for details. In FIG. 3, the perspective relationship of the second gate 312 is moved to a top for convenience of display. In fact, the second gate 312 is disposed between the first gate 311 and the metal shielding units 600. The metal shielding units 600 cannot be electrically connected to other film layers, which reduces the number of film holes. In the top view, the metal shielding units 600 only need to cover the second gate 312 of the unit 310 at least to realize the shielding of the AC signal.

In this embodiment, any one of the metal shielding units 600 is electrically connected to the constant voltage signal terminal of the display panel 100. Please refer to FIG. 4 to FIG. 8 for details. By applying a constant voltage signal to the metal shielding units 600, the metal shielding units 600 can form a certain magnetic field, which can shield the AC signals more stably. Two adjacent metal shielding units 600 are connected to protect the gate units 310 from surrounding AC signals, thereby avoiding uneven display and improving the display performance.

In this embodiment, the display panel 100 further includes a source/drain layer disposed on the first insulating layer 210 and away from the gate layer. The metal shielding layer is electrically connected to the source/drain layer. Please refer to FIG. 4 and FIG. 5 for details. A charged film layer closest to the gate layer is the source/drain layer, which is electrically connected to the source/drain layer through the metal shielding layer to provide the gate units 310 with a best AC signal shielding performance.

In this embodiment, the source/drain layer includes a plurality of source units 510 and a plurality of drain units 520. One of the metal shielding units 600 is electrically connected to one of the source units 510, and/or one of the metal shielding units 600 is electrically connected to the one of one of the drain units 520. Please refer to FIG. 4 and FIG. 5 for details. The source unit 510 and the drain unit 520 are on the periphery of the gate units 310. The source units 510 or/and the drain unit 520 are connected to a convenient connection side of the metal shielding unit 600, which facilitates shielding of the AC signals.

In this embodiment, the source/drain layer includes a plurality of first source/drain units 520 and a second source/drain unit 520 corresponding to the first source/drain units 520. The first source/drain units 520 and the second source/drain unit 520 are arranged in different layers. The first source/drain units 520 include a first sub-source unit 511 and a first sub-drain unit 521. The second source/drain unit 520 includes a second sub-source unit 512, and the second sub-source unit 512 is electrically connected to the first sub-source unit 511. The metal shielding layer is disposed between the first source/drain units 520 and the second source/drain unit 520, and the first source/drain units 520 are close to a side of the substrate 200. The source units 510 are composed of the first sub-source unit 511 and the second sub-source unit 512. The display panel 100 also includes a fifth insulating layer 250 disposed between the first source/drain units 520 and the second source/drain unit 520, a metal shielding layer including the plurality of metal shielding units 600 disposed on the fifth insulating layer 250, and a sixth insulating layer 260 disposed on the metal shielding layer. The sixth insulating layer 260 includes a plurality of third via holes 130. The third via holes 130 extend through the sixth insulating layer 260 and the fifth insulating layer 250. The first sub-source unit 511 and the second sub-source unit 512 are connected through the third via holes 130. Please refer to FIG. 4 to FIG. 7 for details. The display panel 100 also includes a fan-out wiring provided on the same layer as the second sub-source unit 512, so electrical signals on the same layer of the second sub-source unit 512 are more complicated. The metal shielding layer is disposed between the first source/drain units 520 and the second source/drain unit 520, which can better shield the AC signal of the same layer of the second sub-source unit 512, and provide the best AC signal shielding performance for the gate units 310.

In this embodiment, the metal shielding units 600 are disposed at the periphery of the third via holes 130. The metal shielding units 600 are electrically connected to the second source/drain unit 520 through the third via holes 130. Please refer to FIG. 5 for details.

In this embodiment, the metal shielding units 600 are electrically connected to the first sub-drain unit 521 through via holes. There are many layers of film at the source units 510 and the via holes are complicated. By avoiding the complex via holes, simplifying the process, and enhancing a charging stability of the metal shielding units 600, the best AC signal shielding performance for the gate units 310 is provided.

In this embodiment, the display panel 100 further includes a second insulating layer 220 disposed on the source/drain layer of the display panel 100 and an anode layer disposed on the second insulating layer 220. The anode layer includes a plurality of anode units 700, and one of the metal shielding units 600 is electrically connected to one of the anode units 700. The second insulating layer 220 includes a plurality of fourth via holes 140, and the fourth via holes 140 extend through the second insulating layer 220 to expose the metal shielding units 600. For details, please refer to FIG. 6. The metal shielding units 600 are electrically connected to the anode units 700 through the fourth via holes 140, and the via holes of the source/drain layer are also complicated. By avoiding the complex via holes, simplifying the process, and enhancing a charging stability of the metal shielding units 600, the best AC signal shielding performance for the gate units 310 is provided.

In this embodiment, the display panel 100 further includes a metal light-shielding layer 800 on the substrate 200. The plurality of source units 510 of the source/drain layer of the display panel 100 are electrically connected to the metal light-shielding layer 800 through the plurality of first via holes 110. The metal shielding layer and the metal light-shielding layer 800 are electrically connected through the plurality of second via holes 120. The display panel 100 also includes a third insulating layer 230 between the metal light-shielding layer 800 and the gate layer. There are many ways to set the metal shielding units 600, and the first via holes 110 only need to correspondingly extend through from the source units 510 to the electrically connected metal light-shielding layer 800, and the second via holes 120 only need to correspondingly extend through from the metal shielding units 600 to the electrically connected metal light-shielding layer 800, and there is no limitation here. The specific structure of the source/drain layer is also not limited, please refer to FIG. 7 for details. The source units 510 balance a potential of the metal light-shielding layer 800, which is beneficial to the electrical balance and electrical stability of the display panel 100. The metal shielding units 600 are electrically connected to the metal light-shielding layer 800 through the second via holes 120, which can also achieve the constant voltage of the metal shielding units 600. By avoiding the complex via holes, simplifying the process, and enhancing the charging stability of the metal shielding units 600, the best AC signal shielding performance for the gate units 310 is provided.

In this embodiment, the metal shielding units 600 include at least a first shielding part 610 and a second shielding part 620. The first shielding part 610 and the second shielding part 620 are arranged in different layers. The first shielding part 610 is electrically connected to the source units 510 of the source/drain layer of the display panel 100. The second shielding part 620 is electrically connected to the drain unit 520 of the source/drain layer of the display panel 100. Alternatively, the second shielding part 620 is electrically connected to the anode layer of the display panel 100. Please refer to FIG. 8 for details. By setting shielding components in different layers, the AC signal shielding performance for the gate units 310 is enhanced, thereby avoiding uneven display and improving the display performance.

In this embodiment, the display panel 100 includes a first region 132 close to the bending area. In a direction of a data line, a distance between two adjacent array units 150 in the first region 132 is less than a distance between two adjacent array units 150 on the periphery of the first region 132. The metal shielding layer is disposed in the first region 132. A Y-direction represents the direction of the data line in FIG. 9, and the bending area is close to a first side 131. Please refer to FIG. 9 for details. The display panel 100 further includes a pixel definition layer including a plurality of via holes on the anode layer and a light-emitting layer. The first region 132 corresponds to a lower border region of the display panel 100. A spacing between the array units 150 is shortened. A wiring of the film layer where the second sub-source unit 512 of the second source/drain unit 520 is located is used to connect the anode units 700 and an output circuit. For the lower border region, the light-emitting unit of the light-emitting layer covers the first region 132, which can effectively reduce a lower border. Since the first region 132 is in an operation state, the gate units 310 will be affected by a coupling effect of the surrounding AC signals, which results in differences in luminous brightness of each row. The metal shielding units 600 can better enhance the shielding performance of the AC signal of the gate units 310, thereby avoiding uneven display and improving the display performance.

In this embodiment, in the first region 132, there is no array unit 150 in an orthographic projection of a portion of the light-emitting unit of the display panel 100 on the display panel 100, and the light-emitting unit is electrically connected to a corresponding array unit 150 through a lead. For the lower border region, spacings between a portion of the array units in the first region 132 are compressed, and a setting position of the light-emitting unit does not need to be changed. The light-emitting unit and the corresponding array unit 150 are electrically connected by the lead. A spacing where the array unit was originally disposed is reserved. This spacing can be set with fan-out wiring or bending wiring, which greatly reduces a width of the lower border. At the same time, the gate units 310 are also more affected by the coupling effect of the surrounding AC signal. The metal shielding units 600 can well reduce the influence of the coupling effect of the AC signals in the first region, thereby avoiding uneven display and improving the display performance.

In this embodiment, material of the metal shielding layer is any one or a combination of indium tin oxide, nano silver, and carbon nanotubes. The indium tin oxide (ITO) material has good transparency. The nano silver has good thermal conductivity. The carbon nanotubes have good static electricity conduction function, which can enhance the function of the metal shielding units 600.

In this embodiment, a thickness of the metal shielding unit 600 ranges from 500 angstroms to 1000 angstroms.

The present disclosure uses the principle of electrical shielding by setting the metal shielding layer on the gate layer to reduce the influence of the AC signal between two adjacent gate units, thereby avoiding uneven display and improving the display performance.

Please refer to FIG. 1 to FIG. 10. The present disclosure also discloses a manufacturing method of a display panel 100, including the following.

In a step S100, a gate layer including a plurality of gate units 310 is formed over a substrate 200.

In a step S200, a first insulating layer 210 is formed on the gate layer.

In a step S300, a metal shielding layer including a plurality of metal shielding units 600 on the first insulating layer 210.

One of the metal shielding units 600 corresponds to one of the gate units 310, and the metal shielding layer is configured to shield an alternating current (AC) signal between two adjacent gate units 310.

The present disclosure uses the principle of electrical shielding by setting the metal shielding layer on the gate layer to reduce the influence of the AC signal between two adjacent gate units, thereby avoiding uneven display and improving the display performance.

The technical solutions of the present disclosure will now be described in conjunction with specific embodiments.

Please refer to FIG. 1 to FIG. 10. The manufacturing method of the display panel 100 includes the following.

In the step S100, the gate layer including the plurality of gate units 310 is formed over the substrate 200.

In this embodiment, before forming the gate layer, the method further includes the following.

In a step S90, a metal light-shielding layer 800 is formed on the substrate 200.

In a step S91, a third insulating layer 230 is formed on the light-shielding layer.

In this embodiment, the gate layer is formed over the third insulating layer 230 and away from the metal light-shielding layer 800.

In a step S92, an active layer 400 is formed on the third insulating layer 230.

In this embodiment, the display panel 100 further includes the active layer 400 disposed on the third insulating layer 230 and a fourth insulating layer 240 disposed on the active layer 400. The gate layer is disposed on the fourth insulating layer 240 and away from the substrate 200. The active layer 400 includes a plurality of silicon islands, and a source/drain layer is electrically connected to the active layer 400 through via holes. That is, a source unit and a drain unit are electrically connected to the silicon islands through the via holes. In the drawings, a reference numeral "400" is used to represent the silicon island, and the number will not be repeated, please refer to FIG. 1 to FIG. 8 for details.

In a step S93, the fourth insulating layer 240 is formed on the active layer 400.

In this embodiment, the gate layer is disposed on the fourth insulating layer 240 and away from the metal light-shielding layer 800.

In the step S200, the first insulating layer 210 is formed on the gate layer.

In this embodiment, the steps of forming the gate layer and the first insulating layer 210 include the following.

In a step S201, a plurality of first gates 311 are formed on the fourth insulating layer 240.

In a step S202, a first sub insulating layer 211 is formed on the plurality of first gates 311.

In a step S203, a plurality of second gates 312 are formed on the first sub insulating layer 211.

In a step S204, a second sub insulating layer 212 is formed on the plurality of second gates 312.

In the step S300, the metal shielding layer the including the plurality of metal shielding units 600 is formed on the first insulating layer 210.

In this embodiment, the gate units 310 include a first gate 311 and at least one second gate 312 disposed opposite to the first gate 311. The first gate 311 and the second gate 312 are insulated from each other. An orthographic projection of the first gate 311 on the substrate 200 is within an orthographic projection of the corresponding metal shielding units 600 on the substrate 200, and/or an orthographic projection of the second gate 312 on the substrate 200 is within the orthographic projection of the corresponding metal shielding units 600 on the substrate 200. The display panel 100 includes a first sub insulating layer 211 disposed between the first gate 311 and the second gate 312 and a second sub insulating layer 212 disposed on the second gate. The first sub insulating layer 211 and the second sub insulating layer 212 together form the first insulating layer 210. Please refer to FIG. 2 and FIG. 3 for details. In FIG. 3, a perspective relationship of the second gate 312 is moved to a top for convenience of display. In fact, the second gate 312 is disposed between the first gate 311 and the metal shielding units 600. The shielding principle of the metal shielding layer is similar to the electromagnetic shielding principle of the Faraday electromagnetic cage. By setting the metal shielding units 600 near the gate units 310 to reflect the surrounding AC signals, the influence of the AC signal between the gate units 310 is avoided, thereby avoiding uneven display and improving the display performance.

In this embodiment, in comparison to the second gate 312 of the unit 310, the first gate 311 of the unit 310 is disposed on a side close to the substrate 200. The orthographic projection of the second gate 312 of the unit 310 on the substrate 200 is within the orthographic projection of the first gate 311 of the unit 310 on the substrate 200. The orthographic projection of the second gate 312 on the substrate 200 is within the orthographic projection of the metal shielding units 600 on the substrate 200. Please refer to FIG. 2 and FIG. 3 for details. In FIG. 3, the perspective relationship of the second gate 312 is moved to a top for convenience of display. In fact, the second gate 312 is disposed between the first gate 311 and the metal shielding units 600. The metal shielding units 600 cannot be electrically connected to other film layers, which reduces the number of film holes. In the top view, the metal shielding units 600 only need to cover the second gate 312 of the unit 310 at least to realize the shielding of the AC signal.

In this embodiment, any one of the metal shielding units 600 is electrically connected to the constant voltage signal terminal of the display panel 100. Please refer to FIG. 4 to FIG. 8 for details. By applying a constant voltage signal to the metal shielding units 600, the metal shielding units 600 can form a certain magnetic field, which can shield the AC signals more stably. Two adjacent metal shielding units 600 are connected to protect the gate units 310 from surrounding AC signals, thereby avoiding uneven display and improving the display performance.

In this embodiment, after the step S200, the method includes the following.

In a step S210, the source/drain layer is formed on the first insulating layer 210.

In this embodiment, the display panel 100 further includes the source/drain layer disposed on the first insulating layer 210 and away from the gate layer. The metal shielding layer is electrically connected to the source/drain layer. Please refer to FIG. 4 and FIG. 5 for details. A charged film layer closest to the gate layer is the source/drain layer, which is electrically connected to the source/drain layer through the metal shielding layer to provide the gate units 310 with a best AC signal shielding performance.

In this embodiment, the source/drain layer includes a plurality of source units 510 and a plurality of drain units 520. One of the metal shielding units 600 is electrically connected to one of the source units 510, and/or one of the metal shielding units 600 is electrically connected to the one of one of the drain units 520. Please refer to FIG. 4 and FIG. 5 for details. The source unit 510 and the drain unit 520 are on the periphery of the gate units 310. The source units 510 or/and the drain unit 520 is connected to a convenient connection side of the metal shielding unit 600, which facilitates shielding of the AC signals.

In this embodiment, the step S210 includes the following.

In a step S211, the plurality of first source/drain units 520 including a first sub-source unit 511 and a first sub-drain unit 521 are formed on the first insulating layer 210.

In this embodiment, the first source/drain unit 520 includes the first sub-source unit 511 and the first sub-drain unit 521.

In a step S212, a fifth insulating layer 250 is formed on the first source/drain unit 520.

In a step S213, a plurality of third via holes 130 are formed on the fifth insulating layer 250, and the third via holes 130 expose the first sub-source unit 511.

In a step S214, a second drain unit 520 corresponding to the first drain unit 520 is formed on the fifth insulating layer 250.

In this embodiment, the second source/drain unit 520 includes a second sub-source unit 512. The second sub-source unit 512 is electrically connected to the first sub-source unit 511. The metal shielding layer is disposed between the first source/drain unit and the second source/drain unit, please refer to FIG. 4 to FIG. 8 for details.

In this embodiment, after the step S212, the method includes the following.

In a step S2121, the metal shielding layer including the plurality of metal shielding units 600 is formed on the fifth insulating layer 250.

In a step S2122, a sixth insulating layer 260 is formed on the metal shielding layer.

In a step S2123, a plurality of third via holes 130 are formed on the sixth insulating layer 260, the third via holes 130 extend through the sixth insulating layer 260 and the fifth insulating layer 250, and the third via holes 130 expose the first sub-source unit 511.

In this embodiment, the first sub-source unit 511 and the second sub-source unit 512 are connected through the third via holes 130. The display panel 100 also includes a fan-out wiring provided on the same layer as the second sub-source unit 512, so electrical signals on the same layer of the second sub-source unit 512 are more complicated. The metal shielding layer is disposed between the first source/drain units 520 and the second source/drain unit 520, which can better shield the AC signal of the same layer of the second sub-source unit 512, and provide the best AC signal shielding performance for the gate units 310. Please refer to FIG. 4 to FIG. 7 for details.

In this embodiment, the metal shielding units 600 are disposed at the periphery of the third via holes 130. The metal shielding units 600 are electrically connected to the second source/drain unit 520 through the third via holes 130. Please refer to FIG. 5 for details.

In this embodiment, the metal shielding units 600 are electrically connected to the first sub-drain unit 521 through via holes. There are many layers of film at the source units 510 and the via holes are complicated. By avoiding the complex via holes, simplifying the process, and enhancing a charging stability of the metal shielding units 600, the best AC signal shielding performance for the gate units 310 is provided.

In this embodiment, after the step S300, the method further includes the following.

In a step S400, a second insulating layer 220 is formed on the source/drain layer.

In a step S500, an anode layer including the plurality of anode units 700 is formed on the second insulating layer 220.

In this embodiment, after the step S400, the method further includes the following.

In a step S410, a plurality of fourth via holes 140 are formed on the second insulating layer 220.

In this embodiment, the anode layer includes the plurality of anode units 700, and one of the metal shielding units 600 is electrically connected to one of the anode units 700. The second insulating layer 220 includes a plurality of fourth via holes 140, and the fourth via holes 140 extend through the second insulating layer 220 to expose the metal shielding units 600. For details, please refer to FIG. 6. The metal shielding units 600 are electrically connected to the anode units 700 through the fourth via holes 140, and the via holes of the source/drain layer are also complicated. By avoiding the complex via holes, simplifying the process, and enhancing a charging stability of the metal shielding units 600, the best AC signal shielding performance for the gate units 310 is provided.

In this embodiment, the steps of forming the first insulating layer further includes the following.

A plurality of first via holes 110 is formed on the first insulating layer 210, and the first via holes 110 expose the metal light-shielding layer 800.

In this embodiment, the first insulating layer 210 may be the first sub insulating layer 211 or the second sub insulating layer 212.

In this embodiment, the steps of forming fifth insulating layer 250 further include the following.

A plurality of second via holes 120 are formed on the fifth insulating layer 250, and the second via holes 120 expose the metal light-shielding layer 800.

In this embodiment, the display panel 100 further includes the metal light-shielding layer 800 on the substrate 200. The plurality of source units 510 of the source/drain layer of the display panel 100 are electrically connected to the metal light-shielding layer 800 through the plurality of first via holes 110. The metal shielding layer and the metal light-shielding layer 800 are electrically connected through the plurality of second via holes 120. There are many ways to set the metal shielding units 600, and the first via holes 110 only need to correspondingly extend through from the source units 510 to the electrically connected metal light-shielding layer 800, and the second via holes 120 only need to correspondingly extend through from the metal shielding units 600 to the electrically connected metal light-shielding layer 800, and there is no limitation here. The specific structure of the source/drain layer is also not limited. The display panel 100 also includes a third insulating layer 230 disposed between the metal light-shielding layer 800 and the gate layer. The source units 510 balance a potential of the metal light-shielding layer 800, which is beneficial to the electrical balance and electrical stability of the display panel 100. The metal shielding units 600 are electrically connected to the metal light-shielding layer 800 through the second via holes 120, which can also achieve the constant voltage of the metal shielding units 600, please refer to FIG. 7 for details. By avoiding the complex via holes, simplifying the process, and enhancing the charging stability of the metal shielding units 600, the best AC signal shielding performance for the gate units 310 is provided.

In this embodiment, the step of forming the metal shielding layer includes the following.

The metal shielding unit 600 including at least a first shielding part 610 and a second shielding part 620 is formed, and the first shielding part 610 and the second shielding part 620 are arranged in different layers.

In this embodiment, the metal shielding units 600 include at least the first shielding part 610 and the second shielding part 620. The first shielding part 610 and the second shielding part 620 are arranged in different layers. The first shielding part 610 is electrically connected to the source units 510 of the source/drain layer of the display panel 100. The second shielding part 620 is electrically connected to the drain unit 520 of the source/drain layer of the display panel 100. Alternatively, the second shielding part 620 is electrically connected to the anode layer of the display panel 100. Please refer to FIG. 8 for details. By setting shielding components in different layers, the AC signal shielding performance for the gate units 310 is enhanced, thereby avoiding uneven display and improving the display performance.

In this embodiment, the step of forming the gate layer includes the following.

In the first region 132 of the display panel 100 close to the bending area, the plurality of gate units 310 are formed. One of the gate units 310 forms one array unit 150. Please refer to FIG. 9 for details.

In this embodiment, after the step S500, the method further includes the following.

In a step S600, a pixel definition layer including a plurality of via holes are formed on the anode layer.

In a step S700, a light-emitting layer including a plurality of light-emitting units is formed on the pixel definition layer.

In this embodiment, the display panel 100 includes the first region 132 close to the bending area. In a direction of a data line, a distance between two adjacent array units 150 in the first region 132 is less than a distance between two adjacent array units 150 on the periphery of the first region 132. The metal shielding layer is disposed in the first region 132. A Y-direction represents the direction of the data line in FIG. 9. Please refer to FIG. 9 for details. The display panel 100 further includes the pixel definition layer including the plurality of via holes on the anode layer and the light-emitting layer. The first region 132 corresponds to a lower border region of the display panel 100. A spacing between the array units 150 is shortened. A wiring of the film layer where the second sub-source unit 512 of the second source/drain unit 520 is located is used to connect the anode units 700 and an output circuit. For the lower border region, the light-emitting unit of the light-emitting layer covers the first region 132, which can effectively reduce a lower border.

Since the first region 132 is in an operation state, the gate units 310 will be affected by a coupling effect of the surrounding AC signals, which results in differences in luminous brightness of each row. The metal shielding units 600 can better enhance the shielding performance of the AC signal of the gate units 310, thereby avoiding uneven display and improving the display performance.

In this embodiment, in the first region 132, there is no array unit 150 in an orthographic projection of a portion of the light-emitting unit of the display panel 100 on the display panel 100, and the light-emitting unit is electrically connected to a corresponding array unit 150 through a lead. For the lower border region, spacings between a portion of the array units in the first region 132 are compressed, and a setting position of the light-emitting unit does not need to be changed. The light-emitting unit and the corresponding array unit 150 are electrically connected by the lead. A spacing where the array unit was originally disposed is reserved. This spacing can be set with fan-out wiring or bending wiring, which greatly reduces a width of the lower border. At the same time, the gate units 310 are also more affected by the coupling effect of the surrounding AC signal. The metal shielding units 600 can well reduce the influence of the coupling effect of the AC signals in the first region, thereby avoiding uneven display and improving the display performance.

In this embodiment, material of the metal shielding layer is any one or a combination of indium tin oxide, nano silver, and carbon nanotubes. The indium tin oxide (ITO) material has good transparency. The nano silver has good thermal conductivity. The carbon nanotubes have good static electricity conduction function, which can enhance the function of the metal shielding units 600.

In this embodiment, a thickness of the metal shielding unit 600 ranges from 500 angstroms to 1000 angstroms.

The present disclosure uses the principle of electrical shielding by setting the metal shielding layer on the gate layer to reduce the influence of the AC signal between two adjacent gate units, thereby avoiding uneven display and improving the display performance.

The present disclosure also discloses a display device, including any of the above-mentioned display panel 100.

For the specific display panel 100 in the display device, please refer to the above-mentioned embodiments of the display panel 100 and FIGS. 1 to 9, which will not be repeated here.

The present disclosure discloses the display panel and the manufacturing method thereof. The display panel includes the substrate, the gate layer disposed over the substrate, the first insulating layer disposed on the gate layer, and the metal shielding layer disposed on the first insulating layer. The gate layer includes the plurality of gate units. The metal shielding layer includes the plurality of metal shielding units. One of the metal shielding units corresponds to one of the gate units. The metal shielding layer is configured to shield the alternating current signal between two adjacent gate units. The present disclosure uses the principle of electrical shielding by setting the metal shielding layer on the gate layer to reduce the influence of the alternating current signal between two adjacent gate units, thereby avoiding uneven display and improving the display performance.

It can be understood that for those of ordinary skill in the art, equivalent replacements or changes can be made according to the technical solutions of the present disclosure and its inventive concept, and all these changes or replacements shall belong to the protection scope of the appended claims of the present disclosure.

What is claimed is:

1. A display panel, comprising, arranged sequentially, a substrate, a metal light-shielding layer disposed on the substrate, a gate layer disposed over the metal light-shielding layer, a first insulating layer disposed on the gate layer, a source/drain layer disposed over the first insulating layer and a metal shielding layer disposed over the first insulating layer,
   wherein the gate layer comprises a plurality of gate units, the metal shielding layer comprises a plurality of metal shielding units, and one of the metal shielding units corresponds to one of the gate units;
   wherein the metal shielding layer is configured to shield an alternating current signal between two adjacent gate units, and
   wherein a plurality of source units of the source/drain layer are electrically connected to the metal light-shielding layer through a plurality of first via holes, and the metal shielding layer is electrically connected to the metal light-shielding layer through a plurality of second via holes.

2. The display panel as claimed in claim 1, wherein the gate units comprise a first gate and at least one second gate opposite to the first gate, and the first gate is insulated from the second gate; and
   wherein in one sub-pixel, an orthographic projection of the first gate or/and an orthographic projection of the second gate on the substrate is within an orthographic projection of the metal shielding units on the substrate.

3. The display panel as claimed in claim 2, wherein any one of the metal shielding units is electrically connected to a constant voltage signal terminal of the display panel.

4. The display panel as claimed in claim 3, further comprising a second insulating layer disposed over a source/drain layer and an anode layer disposed on the second insulating layer,
   wherein the anode layer comprises a plurality of anode units, and one of the metal shielding units is electrically connected to one of the anode units.

5. The display panel as claimed in claim 3, wherein the metal shielding units at least comprise a first shielding part and a second shielding part, and the first shielding part and the second shielding part are arranged in different layers; and
   the first shielding part is electrically connected to a source unit of a source/drain layer, the second shielding part is electrically connected to a drain unit of the source/drain layer, or the second shielding part is electrically connected to an anode layer.

6. The display panel as claimed in claim 1, wherein the source/drain layer comprises a plurality of first source/drain units and a second source/drain unit corresponding to the first source/drain units, and the first source/drain units and the second source/drain unit are arranged in different layers;
   the first source/drain units comprise a first sub-source unit and a first sub-drain unit, the second source/drain unit comprises a second sub-source unit, the second sub-source unit is electrically connected to the first sub-source unit, and the metal shielding layer is disposed between the first source/drain units and the second source/drain unit.

7. The display panel as claimed in claim 1, wherein the display panel comprises a first region close to a bending area, and in a direction of a data line, a distance between two adjacent array units in the first region is less than a distance between two adjacent array units on a periphery of the first region; and
   wherein the metal shielding layer is disposed in the first region.

8. The display panel as claimed in claim 7, wherein in the first region, there is no array unit in an orthographic projection of a portion of a light-emitting unit of the display panel on the display panel, and the light-emitting unit is electrically connected to a corresponding array unit through a lead.

9. A manufacturing method of a display panel, comprising,
   sequentially:
   forming a metal light-shielding layer on a substrate;
   forming a gate layer comprising a plurality of gate units over the metal light-shielding layer;
   forming a first insulating layer on the gate layer;
   forming a source/drain layer on the first insulating layer; and
   forming a metal shielding layer comprising a plurality of metal shielding units over the first insulating layer,
   wherein one of the metal shielding units corresponds to one of the gate units, and the metal shielding layer is configured to shield an alternating current signal between two adjacent gate units,
   wherein a plurality of source units of the source/drain layer are electrically connected to the metal light-shielding layer through a plurality of first via holes, and the metal shielding layer is electrically connected to the metal light-shielding layer through a plurality of second via holes.

10. The manufacturing method of the display panel as claimed in claim 9, wherein the steps of forming the gate layer and the first insulating layer comprise:
    forming a plurality of first gates on the substrate;
    forming a first sub insulating layer on the first gates;
    forming a plurality of second gates on the first sub insulating layer; and
    forming a second sub insulating layer on the second gate,
    wherein the first sub insulating layer and the second sub insulating layer together form the first insulating layer, the first gates and the second gates are disposed oppositely, and an orthographic projection of the first gates or/and the second gates on the substrate is within an orthographic projection of corresponding metal shielding units on the substrate.

11. The manufacturing method of the display panel as claimed in claim 10, wherein any one of the metal shielding units is electrically connected to a constant voltage signal terminal of the display panel.

12. The manufacturing method of the display panel as claimed in claim 11, wherein after forming the metal shielding layer comprising the plurality of metal shielding units on the first insulating layer, the method further comprises:
    forming a second insulating layer on a source/drain layer of the display panel;
    forming a plurality of fourth via holes on the second insulating layer; and
    forming an anode layer comprising a plurality of anode units on the second insulating layer,
    wherein the metal shielding units are electrically connected to the anode units through the fourth via holes.

13. The manufacturing method of the display panel as claimed in claim 11, wherein the metal shielding units at least comprise a first shielding part and a second shielding part, and the first shielding part and the second shielding part are arranged in different layers; and the first shielding part is electrically connected to a source unit of a source/drain layer, the second shielding part is electrically connected to a drain unit of the source/drain layer, or the second shielding part is electrically connected to an anode layer.

14. The manufacturing method of the display panel as claimed in claim 9, wherein the step of forming the source/drain layer on the first insulating layer comprises:
   forming a plurality of first source/drain units comprising a first sub-source unit and a first sub-drain unit over the first insulating layer;
   forming a fifth insulating layer over the first source/drain units;
   forming a plurality of third via holes on the fifth insulating layer, wherein the third via holes expose the first sub-source unit; and
   forming a second drain unit corresponding to the first drain unit on the fifth insulating layer,
   wherein the second source/drain unit comprises a second sub-source unit, the second sub-source unit is electrically connected to the first sub-source unit, and the metal shielding layer is disposed between the first source/drain units and the second source/drain unit.

15. The manufacturing method of the display panel as claimed in claim 9, wherein
   in the step of forming the first insulating layer, the method further comprises forming a plurality of first via holes on the first insulating layer, and the first via holes expose the metal light-shielding layer;
   in the step of forming the fifth insulating layer, the method further comprises forming a plurality of second via holes on the fifth insulating layer, and the second via holes expose the metal light-shielding layer.

16. The manufacturing method of the display panel as claimed in claim 9, wherein the display panel comprises a first region close to a bending area, and in a direction of a data line, a distance between two adjacent array units in the first region is less than a distance between two adjacent array units on a periphery of the first region; and
   wherein the metal shielding layer is disposed in the first region.

17. The manufacturing method of the display panel as claimed in claim 16, wherein in the first region, there is no array unit in an orthographic projection of a portion of a light-emitting unit of the display panel on the display panel, and the light-emitting unit is electrically connected to a corresponding array unit through a lead.

\* \* \* \* \*